United States Patent
Aldrich (10) Patent No.: US 6,566,720 B2
(45) Date of Patent: May 20, 2003

(54) BASE CELL LAYOUT PERMITTING RAPID LAYOUT WITH MINIMUM CLOCK LINE CAPACITANCE ON CMOS STANDARD-CELL AND GATE-ARRAY INTEGRATED CIRCUITS

(75) Inventor: Lawrence L. Aldrich, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 63 days.

(21) Appl. No.: 09/794,367

(22) Filed: Feb. 27, 2001

(65) Prior Publication Data

US 2002/0040985 A1 Apr. 11, 2002

Related U.S. Application Data (60) Provisional application No. 60/238,228, filed on Oct. 5, 2000.

(51) Int. Cl.[7] ............................................. H01L 29/76
(52) U.S. Cl. ..................... 257/369; 257/204; 257/208; 257/203
(58) Field of Search ................................ 257/369, 371, 257/204, 206, 207, 208, 211, 203

(56) References Cited

U.S. PATENT DOCUMENTS 4,771,327 A * 9/1988 Usui .......................... 257/206
5,760,449 A * 6/1998 Welch ........................ 257/369

* cited by examiner

*Primary Examiner*—Mark V. Prenty
(74) *Attorney, Agent, or Firm*—William J. Kubida; Peter J. Meza; Hogan & Hartson LLP (57) ABSTRACT

A base cell for a gate array or standard cell integrated circuit design has N and P wells organized in checkerboard fashion, each well containing several P and N devices respectively. A first of the plurality of relatively deep P regions is adjacent to at least a first and a second of the plurality of relatively deep N regions. The first relatively deep N region is adjacent to the first relatively deep P region along a first edge of the first relatively deep N region, and to the second relatively deep P region along a second edge of the relatively deep N region. The first and second edges of the relatively deep N region are perpendicular. An array of the base cells therefore has a checkerboard pattern, unlike the striped pattern of typical gate array and standard cell designs. The array of the base cells is amenable to minimizing clock parasitic capacitance when clocked inverters, including the complimentary clocked inverters of latches, are laid out at vertexes of the checkerboard pattern.

17 Claims, 9 Drawing Sheets

BASE CELL LAYOUT PERMITTING RAPID LAYOUT WITH MINIMUM CLOCK LINE CAPACITANCE ON CMOS STANDARD-CELL AND GATE-ARRAY INTEGRATED CIRCUITS

CROSS REFERENCE TO RELATED PATENT APPLICATION

The present invention claims priority from U.S. Provisional Patent application Ser. No. 60/238,228 filed Oct. 5, 2000, the disclosure of which is herein specifically incorporated by this reference.

FIELD OF THE INVENTION

The invention relates to the fields of standard-cell and mask programmed gate-array integrated circuit design. In particular, the invention relates to a cell design for use in CMOS gate-array integrated circuit design that allows reduced parasitic capacitance of clock-line input interconnect.

BACKGROUND OF THE INVENTION

Clock line routing delay is a perennial issue in the art of integrated circuit design. It is known that excessive power drain can result from slow rise and fall times of clock lines because common clocked-inverter or multiplexor-based "flip-flop" designs can conduct "crowbar" current during slow, delayed, clock edges. It is also known that clock skew, or excessive differences in clock delay, to different flip-flops of a chip can cause logical malfunction because signals may propagate in a different clock cycle than that required by the logical design of the chip.

Signal routing delay, including clock routing delay, on an integrated circuit is largely a function (F) of the distributed resistance (R) of the interconnect distributing the signal and of the distributed load capacitance (C) driven by the signal. Function F is a complex function of the way the R and C is structured, is primarily a function of the product of various components of R and C, and that part of function F is the R-C delay of the routing.

The capacitance C comprises gate capacitance of load devices as well as parasitic capacitances coupling the signal routing to adjacent signal routing, metal interconnect on other layers, the integrated circuit substrate, source and drain regions of devices, and other features on the chip. The resistance R comprises the resistance of connections between layers of the chip and resistance resulting from the sheet resistivity of the interconnect. While sheet resistivity of metal interconnect may be as low as 0.05 ohms per square, a 0.25 micron wide metal line only a quarter of an inch long of 0.05 ohm material presents approximately 1250 ohms resistance—enough to be significant.

It is known that high R-C delays in clock line routing on an integrated circuit can cause slow, delayed, rise and fall times. Further, high R-C delays in clock line routing can cause excessive clock skew. It is therefore desirable to keep R-C delays of clock lines low to ensure that chips will work well.

Many techniques have been used to reduce the amount and effect of clock line R-C delay on integrated circuits. Several techniques must often be combined to produce acceptable results. Common techniques include:

1. distributing multiple clock drivers over the chip while balancing driver sizes, and distribution grid or tree layouts, to equalize delay among the multiple grids and trees that result,
2. use of wider-than-minimum metal for clock distribution to reduce R,
3. connecting clock distribution lines into grid or tree structures to reduce R,
4. driving long, slow, or heavily loaded clock lines at multiple points,
5. use of silicon on insulator technologies to reduce parasitic capacitance,
6. deliberate addition of delay to flip-flop designs to reduce skew sensitivity,
7. local buffering of clock lines at, or internal to, flip-flops to reduce the number of devices driven by the clock lines, thereby reducing load C on the clock lines, and
8. spacing clock lines further from other circuitry than the minimum spacing used elsewhere in the chip.

These techniques require substantial design effort, circuitry, processing expense, layout space, or sacrifice of potential performance. It is therefore desirable to reduce the effect of R-C delay of clock lines in other or additional ways.

Many flip-flop designs used today have multiple clocked inverters, or, equivalently, standard inverters driving through clock-controlled transmission gates. These structures are often coupled in pairs, such that a first clocked inverter is driving while a second inverter of the pair is in a high impedance state; when the clock has an opposite value the first inverter is in high impedance and the second inverter drives. A typical D-type edge-triggered flip-flop design incorporates two such clocked inverter pairs. Other clocked gates, such as clocked NAND, NOR, AND-OR-INVERT, and OR-AND-INVERT gates are often paired with clocked inverters to build other flip-flops, including common types of D-type edge-triggered flip-flops having a reset input.

Masked programmed gate-array integrated circuits are typically built on a master-slice having a regular array of P and N type transistors. A base-cell for such an array is a small portion of such a regular array that may be replicated in the circuit layout to form a larger portion of the array. Because latchup considerations require spacing between adjacent N and P type transistors, these transistors are typically built in rows, where devices in the same row are of the same type; this permits placement of more devices per unit area than possible with other designs. A common design for use with a "sea of gates" router alternates pairs of rows of N type devices with pairs of rows of P type devices. Similarly, a common design for use with a channel router has device strips separated by routing channels. Each device strip comprises a row of N type devices adjacent to a row of P type devices.

Standard-cell integrated circuit designs are typically created by first designing a library of standardized designs for performing typical logical functions, each such standardized design is known as a "cell". A logical design of the integrated circuit, or portion thereof, is made that invokes cells of the library; specifying cell types and interconnections between cells. Layout is performed by placing required cells in a chip layout, then interconnecting the cells and any surrounding logic as required by the logical design of the circuit.

Cells of a standard cell library are frequently placed adjacent to other cells of the same library. Each cell must therefore be designed such that placement next to any other cell of the library does not cause unexpected design rule violations (such as spacing violations) or functional problems because of short circuits between portions of the adjacent cells. This is enforced by designing cells according to a set of cell-edge rules. In order to ensure cell-edge rules are met, cell libraries have been designed where the transistors of each cell are fabricated in rows in a regular pattern, with higher-level interconnect defining connections of the transistors. A section of the regular pattern of such devices can also be described as a base-cell.

It is also known that modern dynamic memory devices often have logic in them. For example, memory devices may contain data registers to perform dual-data-rate conversion or on-chip caching functions. Similarly, memory devices are known that have internal refresh address counters and multiplexers, as well as address latches and counters for receiving multiplexed addresses and performing burst-mode read or write operations.

SUMMARY OF THE INVENTION

A base-cell layout has been devised that incorporates N-channel devices in P-well, and P-channel devices in N-well, in each row of the base cell. This base cell is suitable for either gate-array or standard-cell design methodology. The base cell has two rows, such that a region of P-channel devices in N-well of the second row is adjacent to the region of N-channel devices in P-well of the first row.

The base-cell is copied and arrayed, with mirrored and flipped copies of the cell, in the gate-array or standard-cell design layout such that the well masks have a checkerboard appearance. This array layout is intended for fabrication in a junction-isolated (not a silicon-on-insulator) integrated circuit fabrication process which may be of the N-Well, P-Well, or Twin-Well type.

This results in a gate array that, while it has fewer total devices per unit area than does a typical row-based gate array, is more convenient for laying out of clocked-gate pairs and multiplexor circuits. Circuits having large quantities of clocked-gate, including clocked inverter pairs, can be laid out into the gate array with less interconnect resistance and capacitance on the clock and not(clock) lines than attained on typical layouts.

Particularly, the base-cell layout of the present invention allows on-chip clock lines to be laid out in a substantially straight, linear arrangement that significantly aids overall device performance and design time to market with only a small increase in the requisite on-chip area, or "real estate".

The foregoing and other features, utilities and advantages of the invention will be apparent from the following more particular description of a preferred embodiment of the invention as illustrated in the accompanying drawings.

DETAILED DESCRIPTION

A latch as commonly used in the art of CMOS integrated circuit design has a first clocked inverter, comprising first 100 (FIG. 1) and second 102 pulldown devices and first 106 and second 104 pullup devices. The latch also has a second clocked inverter, comprising third 108 and fourth 110 pulldown devices and third 112 and fourth 114 pullup devices. The latch also has an inverter stage 116 generating an output Q, and receives three inputs, IN, Clock, and Not(Clock).

It is known that two latches of this type may be combined, with reversed Clock and Not(Clock) inputs, to form an edge-triggered D-type flip-flop. It is also known that one or more of the clocked inverters of one or more latches of an edge-triggered D-type flip-flop may be replaced with one or more clocked gates of other types to add additional inputs, such as a reset or set input, to the flip-flop.

For this patent, the term "clocked gates" includes clocked inverters, clocked NOR gates, clocked NAND gates, clocked AND-OR gates, and other types of complex, clocked gates. The inverter of one or more latches may also be replaced by a NAND, NOR, or other gate as required to provide appropriate logic function for the flip-flop. Some flip-flop designs also include a clock inverter to produce one phase of the clock locally.

Modern integrated circuits may incorporate many hundreds, or even thousands, of latches and flip-flops of this type.

Figure 1:
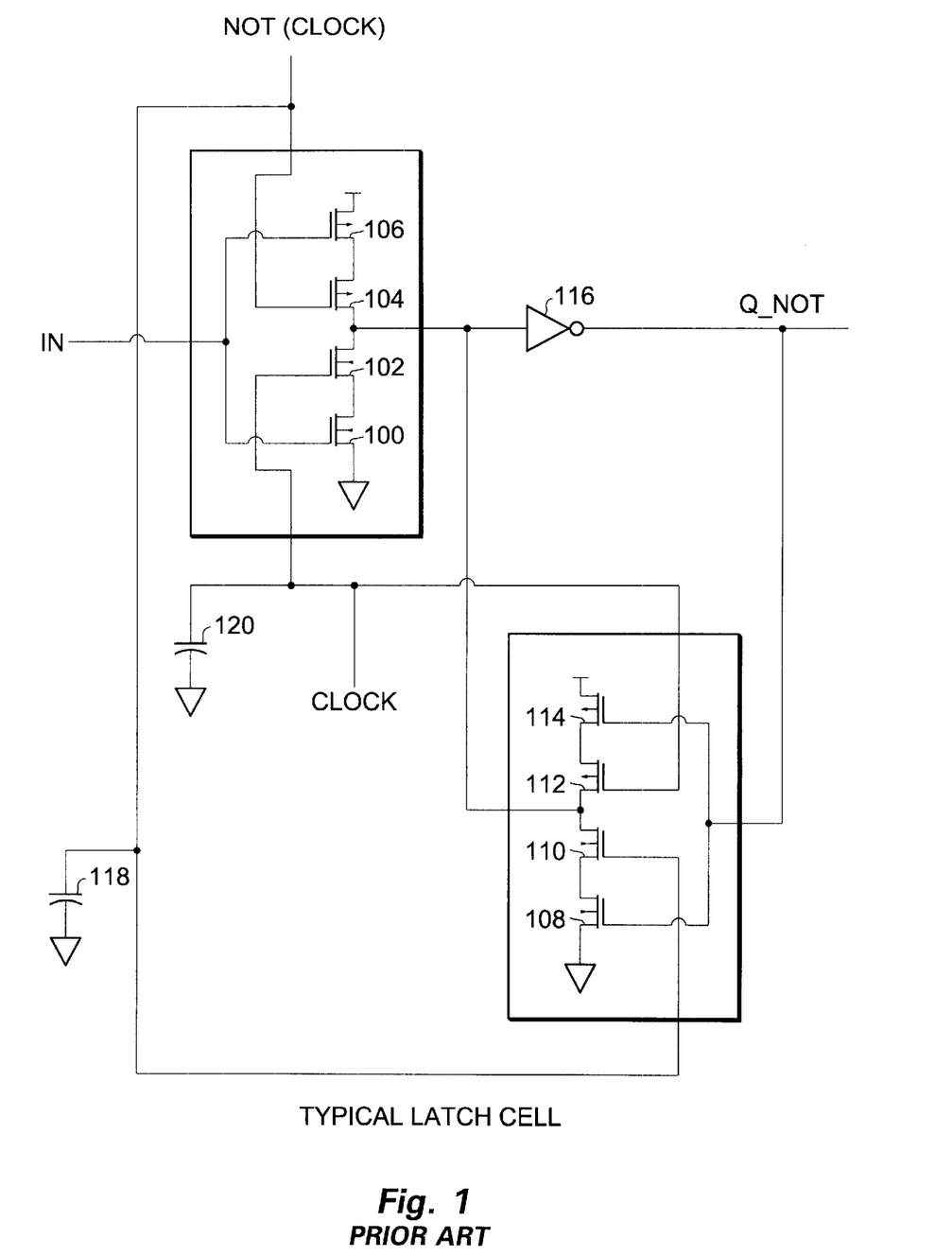
FIG. 1 is a schematic of a Latch design, as commonly used in the design of CMOS integrated circuits.

In every such latch, there is inevitably parasitic routing capacitance, such as capacitances 118 and 120, on the Clock and Not(Clock) lines of the latch. Interconnect resistance is also inevitable. This parasitic routing capacitance combines with other capacitances, including gate capacitance of the devices 104, 102, 110, and 112, and resistance, including interconnect resistance, to produce an effective RC delay between a clock driver and clock devices, such as devices 104, 102, 110, and 112.

Figure 2:
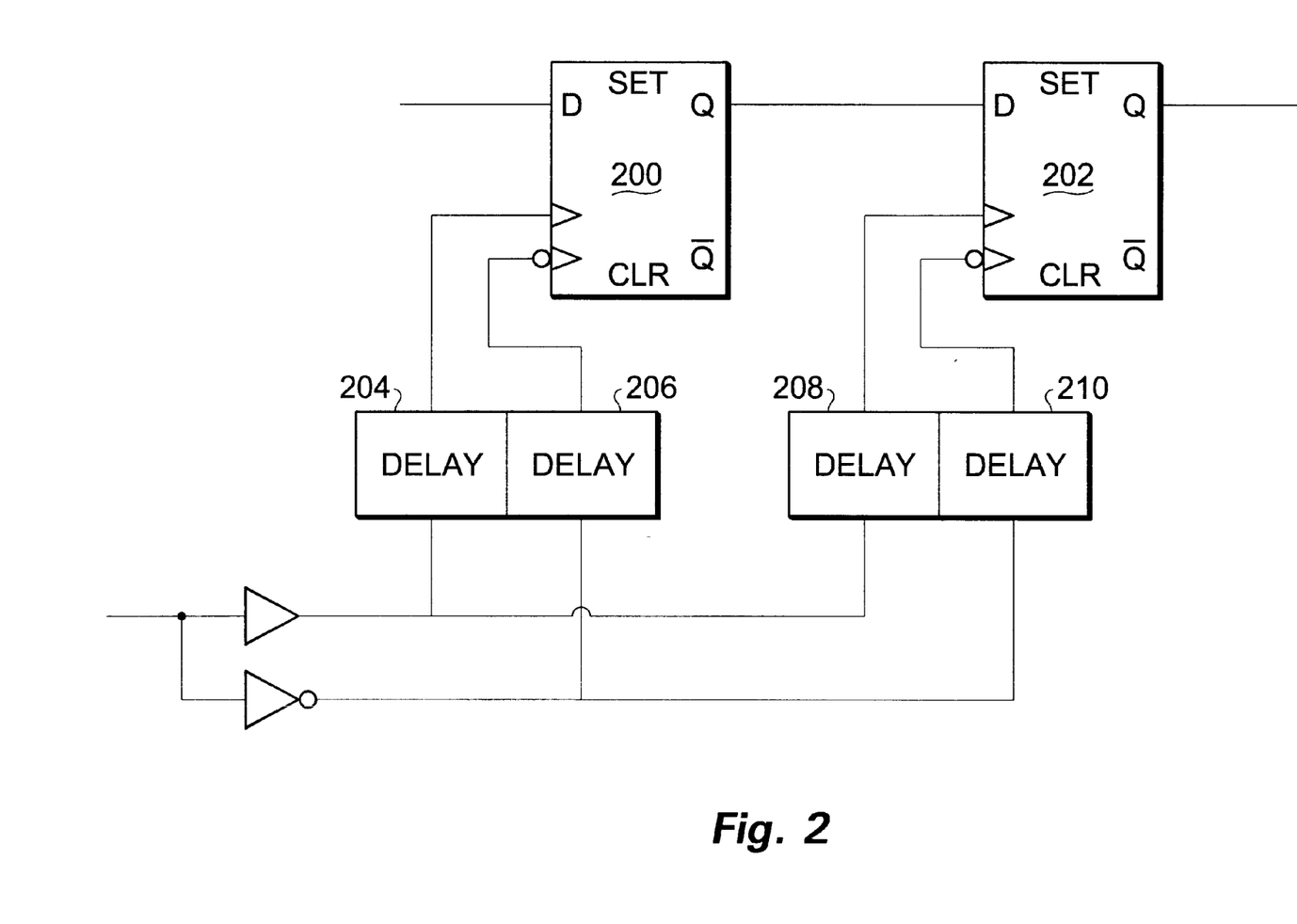
FIG. 2, an example of racethrough caused by clock-skew should RC delays of clock lines be excessive.

Consider a pair of D-type flip-flops 200 (FIG. 2) and 202, each built of a pair of the latches of FIG. 1. There are potentially four different RC delays 204, 206, 208, and 210 on the clock and not(clock) lines. It is known that, if delays 208 and 210 on the clock and not(clock) lines of the second flip-flop 202 are greater by a certain amount than the delays 204 and 206 on clock and not(clock) lines of the first flip-flop 200, then data may skip through the second flip-flop 202 in the same clock cycle in which it is sampled by the first flip flop 200. This is one of several types of mal-operation that can be caused by excessive difference in clock delay, known as excessive clock skew.

It is known that the effective RC delay can be reduced in several ways, including holding routing capacitances 118 (FIG. 1) and 120 to a minimum.

A traditional base cell for a CMOS integrated circuit layout has a strip of P-type devices. In modern processes these may be formed in an N-well 316 (FIG. 3) where polysilicon gate "dogbones" 300, 302, 304, 306, 308, 310, 312, and 314 cross P-type diffused regions 320, 322, and 324. These polysilicon regions are known as dogbones because they often are made narrower in their middles than at their ends, where they must be wide enough for contacts.

Figure 3:
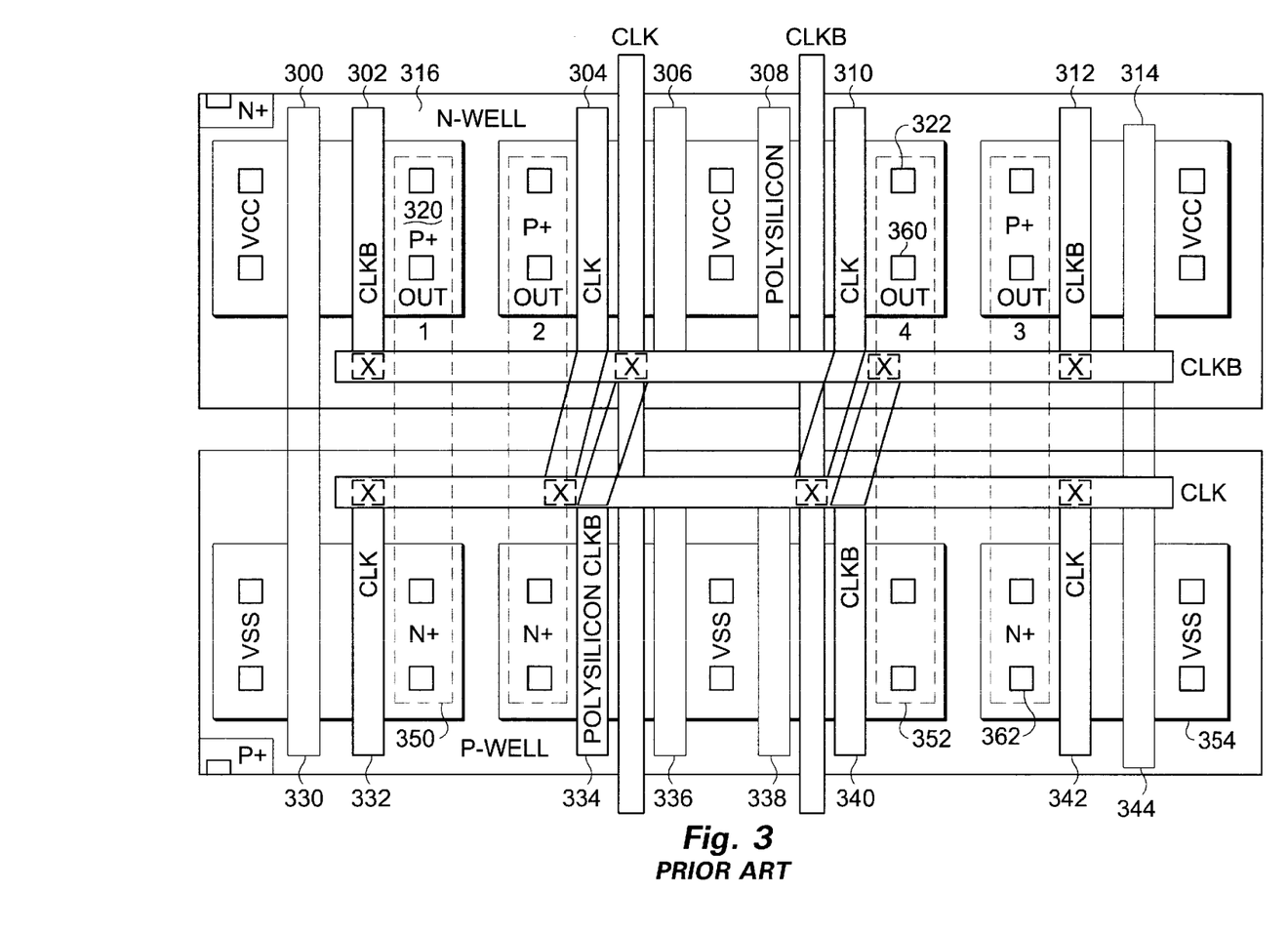
FIG. 3, a layout of a gate array base-cell as known in the art.

Similarly, there is a parallel strip of N-type devices, formed in a P-well 326 where polysilicon gate "dogbones"

330, 332, 334, 336, 338, 340, 342, and 344 cross N-type diffused regions 350, 352, and 354. Each dogbone may be contacted to by contacts (not shown) at either end for gate connection to the devices, and source or drain connections may be made at contact locations, such as potential contact locations 360 and 362, to the diffused regions. In each base cell, there are also well and substrate ties for prevention of latchup as known in the art.

Figure 4:
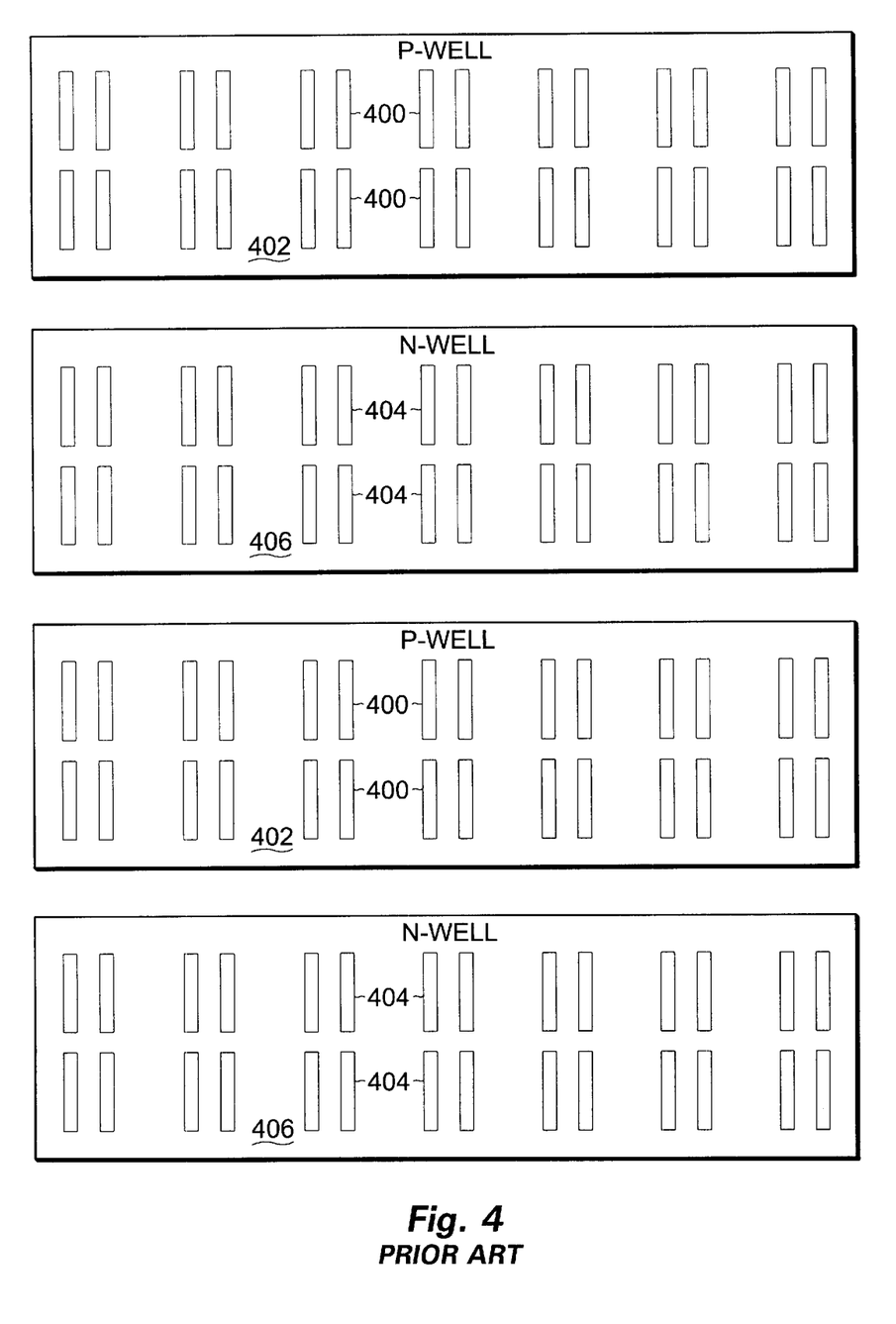
FIG. 4, an example layout of an array of transistors in base cells as known in the art, the transistors being in rows of N and P type transistors in P and N type wells respectively.

A typical CMOS integrated circuit formed from these base cells has multiple base cells arrayed in mirrored form, such that the same-polarity wells of adjacent base cells are merged to the greatest extent possible. This is typically done to avoid the chip-area cost associated with well-to-well spacing design rules. As a result, distinct pairs of rows of N-type devices 400 (FIG. 4) in P-wells 402, and pairs of rows of P-type devices 404 in N-wells 406 may be seen in a typical array; these rows may extend for great distances across each chip. It is known that customized contact, metal, and via (metal to metal connection) layers may be used to connect the devices of the base cells into circuitry, including circuitry forming multiple clocked inverters or flip-flops. Similarly, standard cells can be designed incorporating similar base-cells; the standard cells being interconnected to form an integrated circuit.

A base cell of the present invention also has two rows. In the first row, it has a short strip of P-type devices, where polysilicon gate dogbones 500 (FIG. 5) cross P-type diffused regions 502 in a relatively deep N-type region, which may be an N-well 504. Adjacent to, and in the same row as, the short strip of P-type devices is a strip of N-type devices where polysilicon gate dogbones 506 cross N-type diffused regions 508 in a relatively deep P-type region, which may be a P-well 510. Deep P region 516 is adjacent to deep N region 524 along a first edge, and to relatively deep N region 504 along a second edge, where the first and second edge are perpendicular. Similarly relatively deep N region 504 is adjacent to relatively deep P region 516 along a first edge, and to relatively deep P region 510 along a second edge, where the first and second edge are perpendicular.

Figure 5:
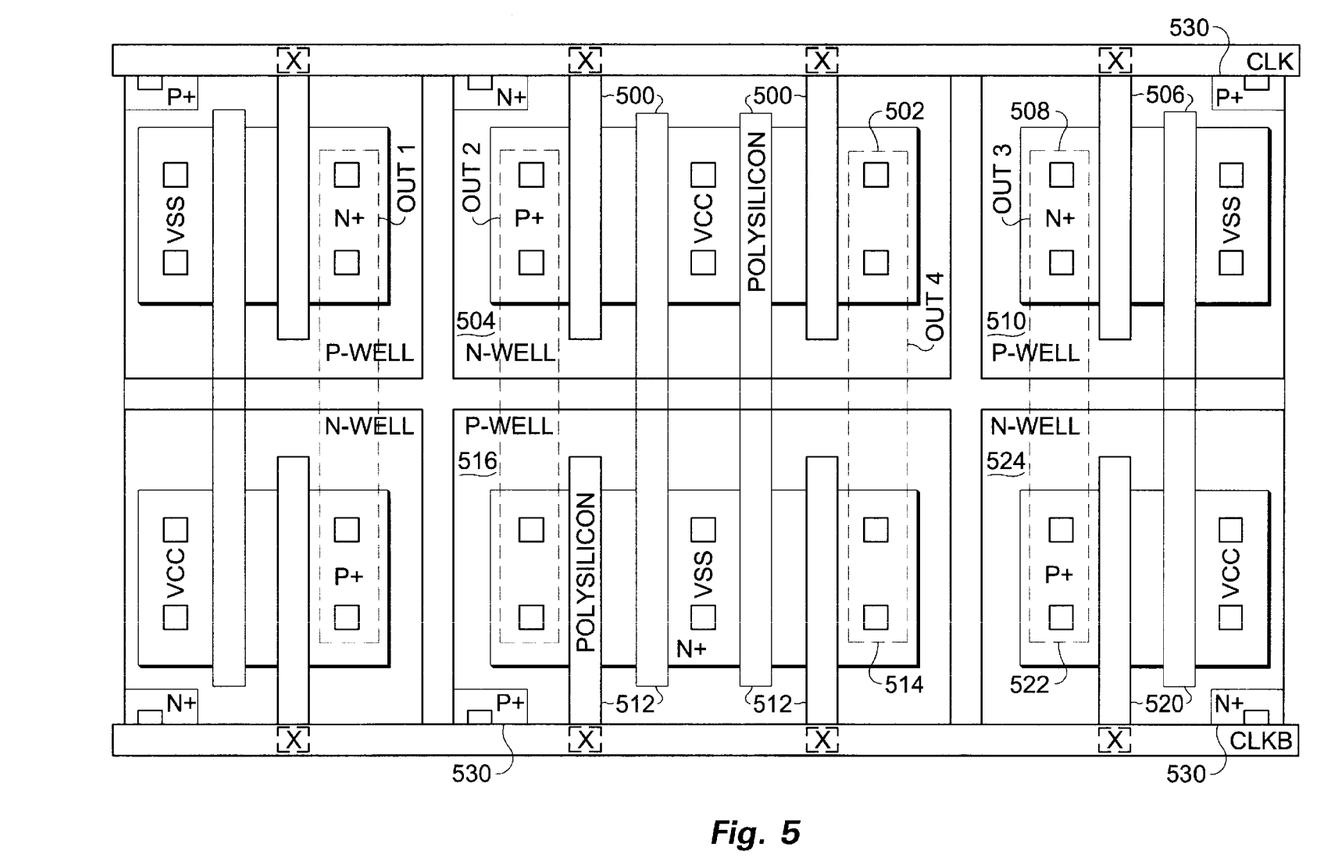
FIG. 5, an array of transistors according to the base-cell layout of the present invention.

In the second row, adjacent to the short strip of P-type devices of the first row, is a short strip of N-type devices formed by polysilicon gate dogbones 512 crossing N-type diffused regions 514 in a relatively deep P-type region, which may be a P-well 516. Similarly, adjacent to the strip of N-type devices of the first row, is a strip of P-type devices formed by polysilicon gate dogbones 520 cross P-type diffused regions 522 in a relatively deep N-type region, which may be an N-well 524. In each base cell, there are also well and/or substrate ties 530 for prevention of latchup as known in the art.

Four of the relatively deep regions, or wells, of the base cell are organized about a vertex 532.

The base cell provides a pattern of two-high and four-high with center tap stacks of devices. These can be coupled into a variety of logic gates in the manner known in the art of CMOS integrated circuit design.

Figure 6:
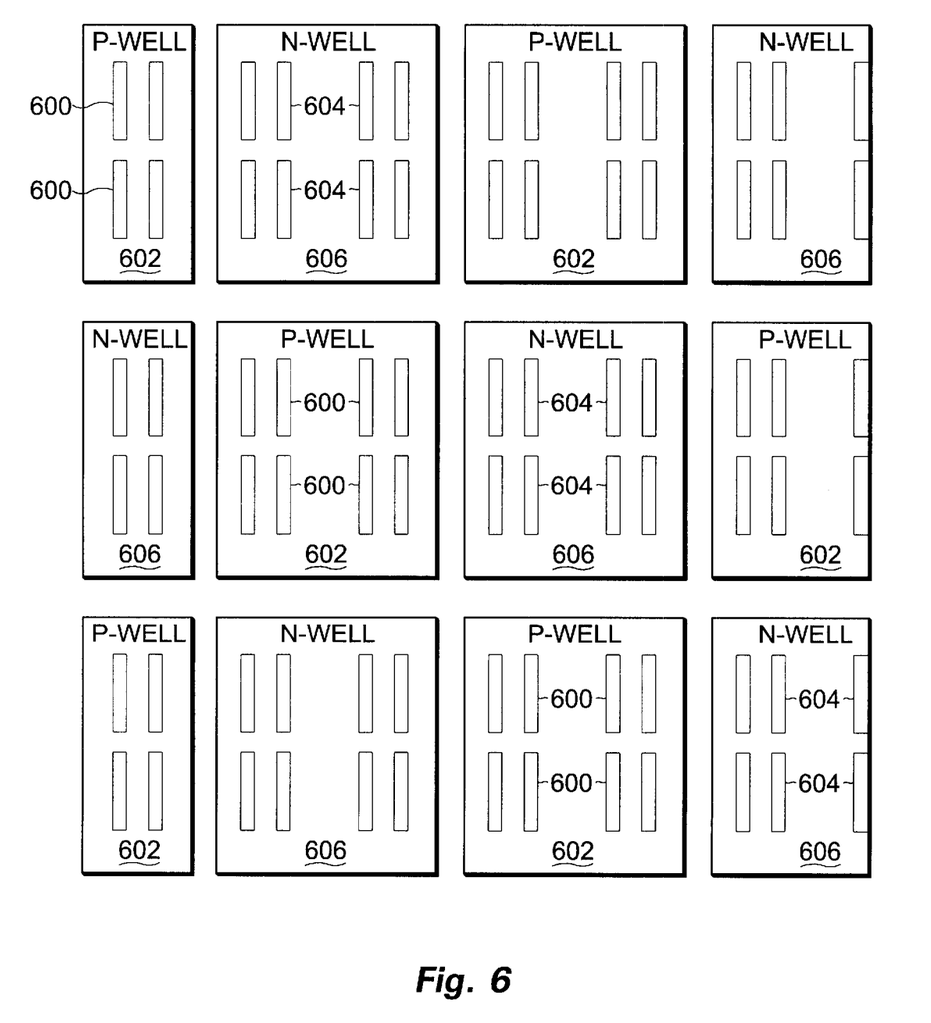
FIG. 6, an example layout of an array of transistors base cells of the present invention, having wells organized in "checkerboard" fashion.

A typical CMOS design layout of the present invention has multiple base cells arrayed in mirrored form, such that the wells of adjacent base cells are merged to a significant extent. As a result, a checkerboard pattern of short strips of N-type devices 600 (FIG. 6) in P-wells 602, alternating with short strips of P-type devices 604 in N-wells 606 may be seen in each row pair of the array. These row pairs are fabricated such that each first row pair is adjacent to a second row pair such that a strip of N-type devices in P-well of the first row pair is adjacent to a strip of P-type devices in N-well of the second row pair. This array therefore presents a checkerboard pattern of alternating device types in alternating well types.

A CMOS base cell of the present invention lends itself to being connected with contact and metal layers into a latch similar to that of FIG. 1. Such a latch has an input IN (FIG. 7), an output Q, a power rail 700, a ground rail 702, a CLOCK input 704, and a NOT(CLOCK) input 706. The two clock devices 708 and 709 and two not(clock) devices 710 and 711 of the latch can be laid out where each pair is in one column, thereby allowing minimum CLOCK and NOT (CLOCK) routing. The CLOCK and NOT(CLOCK) devices are further laid out about a vertex 712 of the checkerboard-like pattern of N-wells and P-wells. This allows for small parasitic loads on the clock and not(clock) lines.

The latch as illustrated utilizes a first level of metal, including the clock 704, not(clock) 706, power rail 700, and ground rail 702, and a second level of metal having the IN input and Q output. The metal layers are connected together with vias 716, and to the polysilicon dogbones and diffused regions with contacts 718 as known in the art. The metal layer used for each of these signals is the designer's choice, latches built on an array of the present invention may have actual layout varying from that illustrated in FIG. 7.

Figure 7:
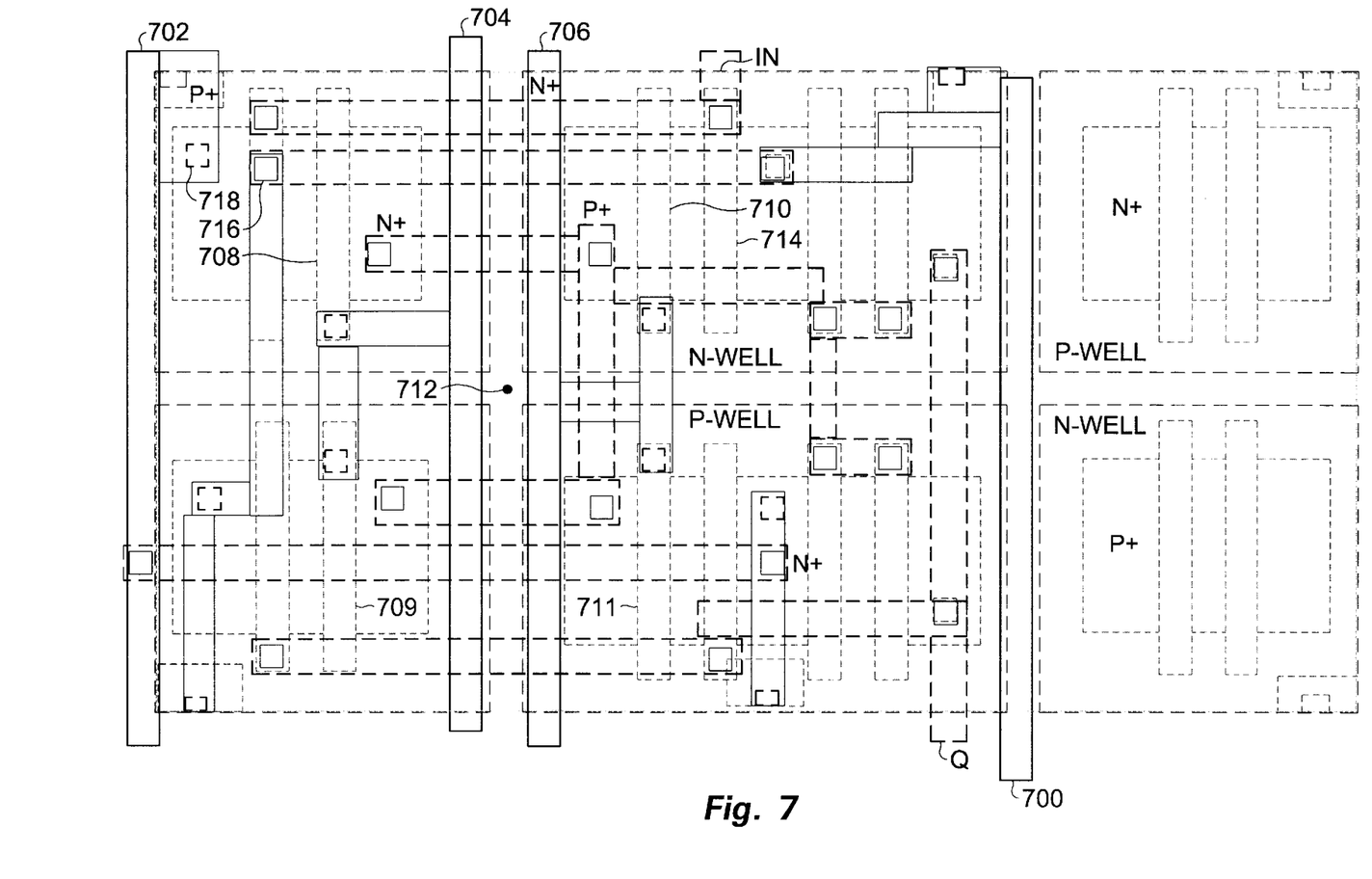
FIG. 7, an example of a latch implemented on a base cell of the present invention.

Not all CLOCK and NOT(CLOCK) devices need be at vertexes of the pattern, for example but not by way of limitation, devices 711 and 714 could have been switched in the latch of FIG. 7 without unduly detracting from the principles of the invention. It is desirable, however, that parasitic capacitance of the CLOCK and NOT(CLOCK) lines be held low by minimizing the length of interconnect used to connect these lines, wherever they may be located in a latch or flip-flop, to their associated transistors. Minimizing the length of interconnect connecting these lines to their transistors is done by placing the transistors close to the associated CLOCK or NOT(CLOCK) line.

Similarly, other register types, including D-type flip-flops and D flip-flops with reset or preset inputs, can also be laid out such that each component latch has little parasitic interconnect load on its CLOCK and NOT(CLOCK) lines.

While the invention has been described with reference to CLOCK and NOT(CLOCK) input signals to latches, since flip-flops are built from latches the invention is equally applicable to flip-flops. The invention is also applicable to other forms of logic as well, including high-speed multiplexers. With multiplexers having two complementary select inputs, SEL and SELX, the SEL line is equivalent to a CLOCK, and the SELX line equivalent to a NOT(CLOCK) line as heretofore described.

Figures 8, 8A:
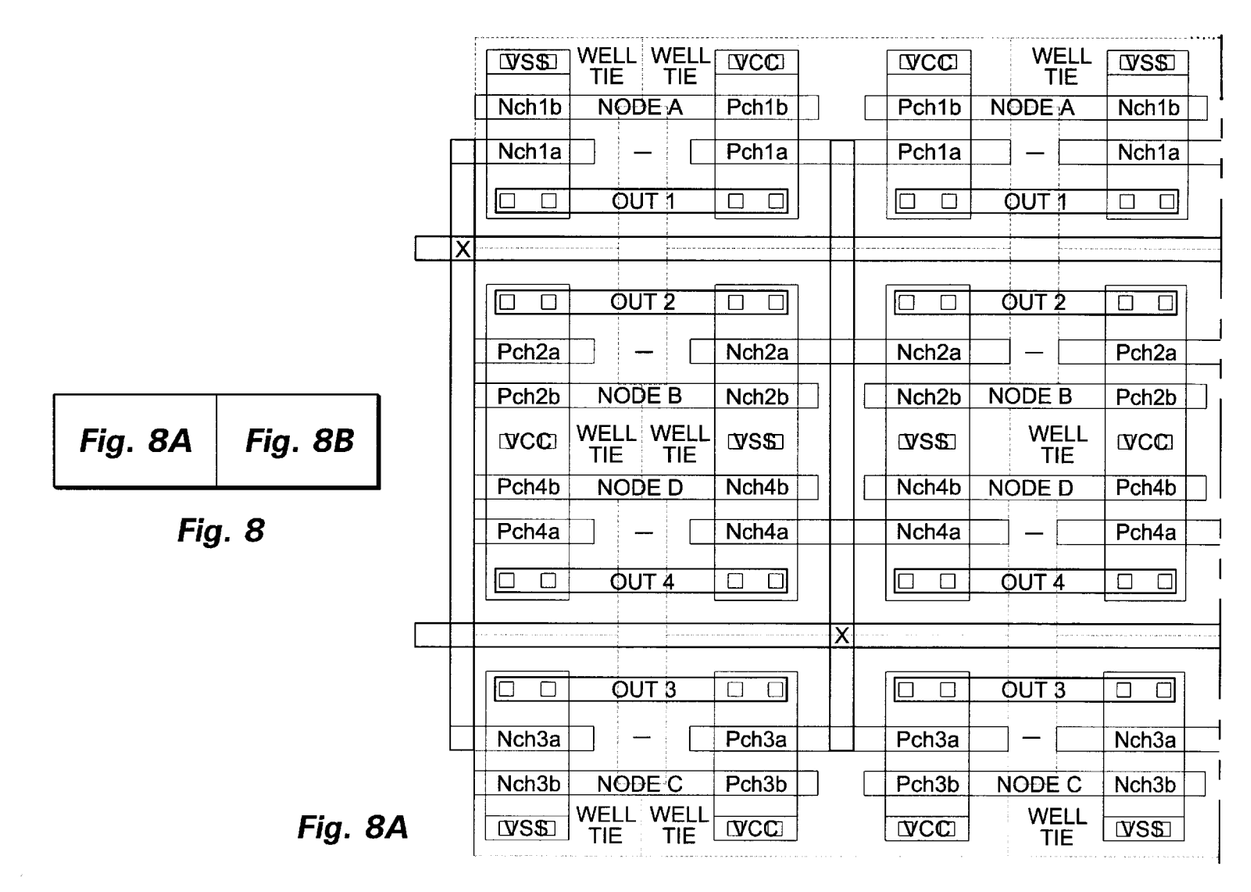
FIGS. 8, 8A and 8B, an example of a particular implementation of the present invention illustrating an arrayed, simplified clocking circuit and having outboard clk and clkb lines with an alternating, reversed Pch2<->Nch2 and Pch4<->Nch4 wireup.
Figure 8B:
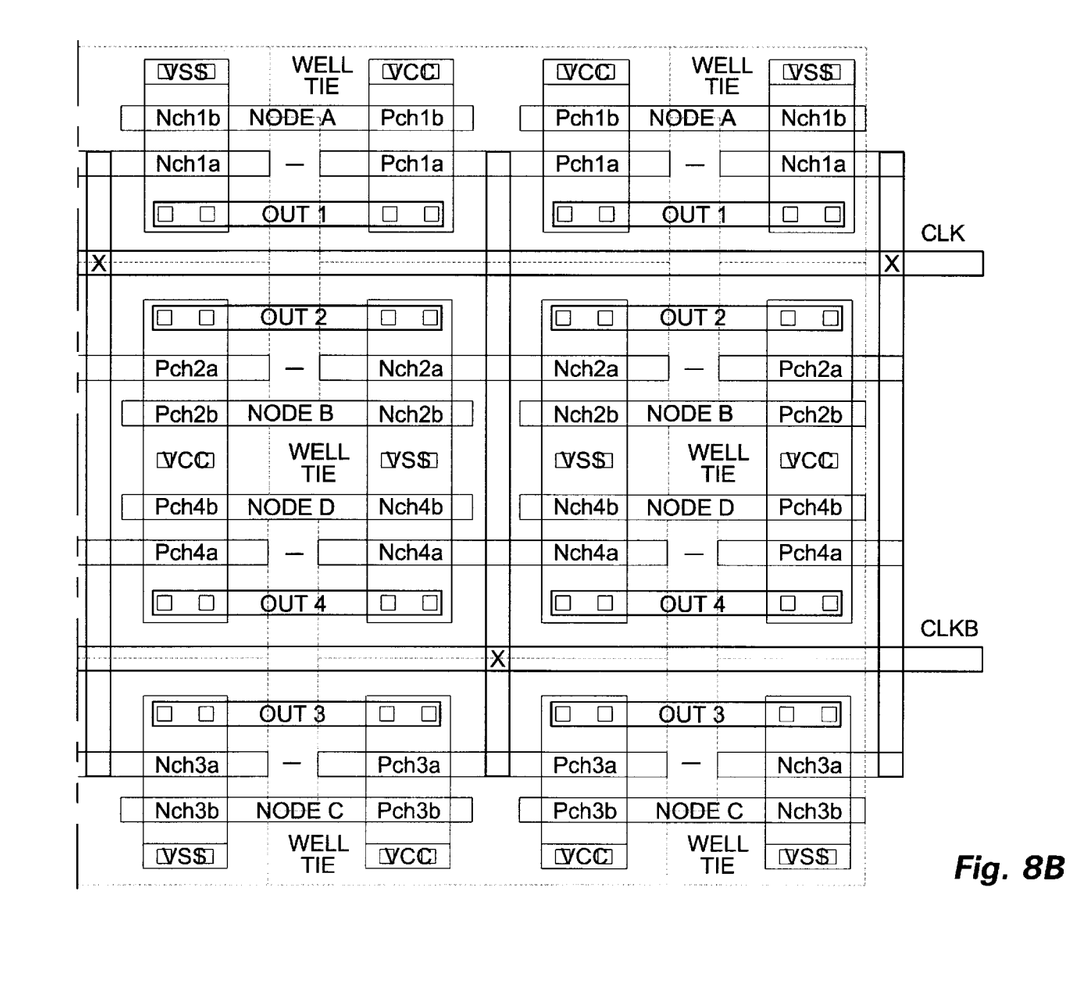

FIG. 8 depicts an example of a particular implementation of the present invention illustrating an arrayed, simplified clocking circuit and having outboard clk and clkb lines with an alternating, reversed Pch2<->Nch2 and Pch4<->Nch4 wireup.

The base cell design of the present invention also lends itself to minimizing load on select lines of multiplexers, such as two-to-one multiplexers implemented as paired stacks of four devices. Each stack of such a multiplexer resembles a clocked inverter, differing in that the clock and not(clock) devices of clocked inverters connect to select and not(select) inputs of the multiplexer instead.

P-well and N-well junction-isolated processes are known in addition to the dual-well junction-isolated process illustrated. In a P-well process, the substrate is utilized in place of an N-Well. Similarly, in an N-well process the substrate is utilized in place of a P-Well as a P-diffused region deep relative to N-type diffused device regions. Base cells equivalent to those discussed can therefore be fabricated in a P-well process or in an N-well process.

The invention has been described with reference to a base cell in which all transistors are present in all designs. The invention is also applicable to standard-cell designs wherein particular "dogbones" that are not needed for particular cell designs are omitted from the layout. Omitting unneeded devices has advantage in that parasitic capacitances and resistances are reduced, while cell-edge rules are still enforced.

In a particular group of embodiments of the present invention, an array of latch cells having layout as herein described is coupled into an array of data registers integrated with a Dynamic RAM circuit. In certain of these embodiments, the data registers as herein described are utilized to form dual-data-rate and quad-data-rate data output registers and internal cache registers.

While the invention has been particularly shown and described with reference to a preferred embodiment thereof, it will be understood by those skilled in the art that various other changes in the form and details may be made without departing from the spirit and scope of the invention.

What is claimed is:

1. An integrated circuit layout section comprising:
   a plurality of relatively deep P regions;
   a plurality of N-channel devices in each of the relatively deep P regions;
   a plurality of relatively deep N regions;
   a plurality of P-channel devices in each of the relatively deep N regions; and
   higher-level interconnect coupling the N-channel devices and the P-channel devices into an array of latches;
   wherein the relatively deep N regions and relatively deep P regions are organized in a checkerboard pattern in at least a first row and a second row, each row having at least two relatively deep N regions alternating with two relatively deep P regions, such that each relatively deep N region of the first row is adjacent to a relatively deep P region of the second row.

2. The integrated circuit layout section of claim 1, wherein the plurality of relatively deep N regions and relatively deep P regions organized in a checkerboard pattern further comprises a third row, such that each relatively deep N region of the third row is adjacent to a relatively deep P region of the second row.

3. The integrated circuit layout section of claim 1, wherein the array of latches has at least a first and a second clock line, wherein gate elements of the plurality of N-channel devices are oriented in a first direction, gate elements of the plurality of P-channel devices are oriented in the first direction, the first clock line couples to gate elements of a first N-channel device and to a first P-channel device, and where the first N-channel device is in a first relatively deep P region adjacent to a first relatively deep N region containing the first P-channel device.

4. The integrated circuit section of claim 3, wherein the first relatively deep P region is adjacent in the first direction to the first relatively deep N region.

5. The integrated circuit section of claim 3, wherein the second clock line couples to gate elements of a second N-channel device and to a second P-channel device, and where the second N-channel device is in a second relatively deep P region adjacent to a second relatively deep N region containing the second P-channel device; and wherein the second relatively deep P region is adjacent to the first relatively deep N region.

6. An integrated circuit layout comprising a first integrated circuit layout section further comprising:
   a plurality of relatively deep P regions;
   a plurality of N-channel devices in each of the relatively deep P regions;
   a plurality of relatively deep N regions;
   a plurality of P-channel devices in each of the relatively deep N regions; and
   higher-level interconnect coupling the N-channel devices and the P-channel devices for the first layout section into an array of latches, and further comprising a second layout section comprising a memory-cell array;
   wherein the relatively deep N regions and relatively deep P regions are organized in a checkerboard pattern; and
   wherein the plurality of relatively deep N regions and relatively deep P regions organized in a checkerboard pattern are organized in at least a first row and a second row, each row having at least two relatively deep N regions alternating with two relatively deep P regions, such that each relatively deep N region of the first row is adjacent to a relatively deep P region of the second row.

7. The integrated circuit layout of claim 6, wherein the second layout section comprises a dynamic random access memory (DRAM) cell array.

8. A method of designing signal lines of an integrated circuit designed on a gate array process such that the clock lines have minimum parasitic loading comprising:
   providing a base cell array section further comprising:
      a plurality of relatively deep P regions,
      a plurality of N-channel devices in each of the relatively deep P regions,
      a plurality of relatively deep N regions, and
      a plurality of P-channel devices in each of the relatively deep N regions;;
      wherein the relatively deep N regions and relatively deep P regions are organized in a checkerboard pattern;
   designing at least one pair of signal and not(signal) lines passing close to at least one vertex of the checkerboard pattern;
   utilizing a first device of the plurality of N-channel devices as an input device of a first logical cell, the first device in a first of the plurality of relatively deep P regions located adjacent to a first of the plurality of relatively deep N regions and adjacent to the vertex of the checkerboard pattern;
   utilizing a second device selected from the plurality of P-channel devices as an input device of the first logical cell, the second device in the first of the plurality of relatively deep N regions.

9. The method of claim 8, wherein the first signal line is a clock line, and the not (signal) line is a not (clock) line.

10. An integrated circuit device comprising:
   a substrate;
   a plurality of regions formed in said substrate having a first conductivity type;
   a plurality of regions formed in said substrate having a second conductivity type;
   said plurality of regions of said first conductivity type being substantially linearly interspersed between said plurality of regions of said second conductivity type;
   at least one switching device formed in each of said plurality of first conductivity type regions;

at least one switching device formed in each of said plurality of second conductivity type regions; and at least one clock signal line coupled to said at least one switching device formed in said plurality of first conductivity type regions extending substantially linearly adjacent said plurality of first and second conductivity type regions.

11. The integrated circuit device of claim 10 further comprising:

at least one other clock signal line coupled to said at least one switching device formed in said plurality of second conductivity type regions extending substantially linearly adjacent said plurality of first and second conductivity type regions.

12. The integrated circuit device of claim 11 wherein said at least one other clock signal line is a complement of said at least one clock signal line.

13. The integrated circuit device of claim 10 wherein said plurality of regions of said first and second conductivity types comprise wells.

14. The integrated circuit device of claim 10 wherein said plurality of regions of said first and second conductivity types comprise N and P regions respectively.

15. An integrated circuit device comprising:

a substrate;

a first substantially linearly disposed array of alternating regions of first and second conductivity type regions formed in said substrate;

a second substantially linearly disposed array of alternating regions of said first and second conductivity type regions formed in said substrate adjacent said first substantially linearly disposed array such that a region of a first conductivity type in said first substantially linearly disposed array is laterally displaced adjacent a region of a second conductivity type in said second substantially linearly disposed array; and first and second substantially linear disposed clock lines; said first clock line adjacent said first substantially linearly disposed array and said second clock line adjacent said second substantially linearly disposed array.

16. The integrated circuit device of claim 15 wherein said first clock line is coupled to at least one switching device in said regions of said first conductivity type and said second clock line is coupled to at least one switching device in said regions of said second conductivity type.

17. The integrated circuit device of claim 15 wherein said first and second conductivity types comprise N and P channel wells respectively.

* * * * *